United States Patent
Ikeda et al.

(10) Patent No.: US 9,960,333 B2
(45) Date of Patent: May 1, 2018

(54) LIGHT-EMITTING DEVICE INCLUDING LIGHT-EMITTING ELEMENTS CONNECTED IN SERIES AND LIGHT-EMITTING ELEMENTS CONNECTED IN PARALLEL

(71) Applicant: NICHIA CORPORATION, Anan-shi, Tokushima (JP)

(72) Inventors: Tadaaki Ikeda, Anan (JP); Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days. days.

(21) Appl. No.: 15/246,730

(22) Filed: Aug. 25, 2016

(65) Prior Publication Data

US 2017/0062684 A1    Mar. 2, 2017

(30) Foreign Application Priority Data

Aug. 31, 2015 (JP) ................................. 2015-171571

(51) Int. Cl.
*H01L 29/18* (2006.01)
*H01L 33/62* (2010.01)
*H01L 25/075* (2006.01)

(52) U.S. Cl.
CPC .......... *H01L 33/62* (2013.01); *H01L 25/0753* (2013.01)

(58) Field of Classification Search
CPC ............................ H01L 33/62; H01L 25/0753

USPC ........................................................... 257/88
See application file for complete search history.

(56) References Cited

U.S. PATENT DOCUMENTS

| | | | | |
|---|---|---|---|---|
| 2011/0309379 A1* | 12/2011 | Shibusawa | ................ | F21K 9/00 257/88 |
| 2014/0054628 A1* | 2/2014 | Sugiura | ............... | H01L 25/0753 257/91 |
| 2015/0016109 A1* | 1/2015 | Ogata | .................... | H05K 3/284 362/249.02 |

FOREIGN PATENT DOCUMENTS

| JP | 05-025752 U | 4/1993 |
|---|---|---|
| JP | 2013-125869 A | 6/2013 |

* cited by examiner

*Primary Examiner* — Jami M Valentine

(57) ABSTRACT

A light-emitting device includes a substrate having a first surface extended in a first direction, a second surface opposite to the first surface, a third surface between the first and second surfaces and extended in the first direction, and a fourth surface opposite to the third surface, a conductive member including at least four element mounting portions arranged in the first direction on the first surface, a first wiring portion on the second surface, a second wiring portion on the third surface, and a third wiring portion on the fourth surface, and first, second, third, and fourth light-emitting elements respectively mounted on the four element mounting portions. With the first, second, and third wiring portions, the first and second light-emitting elements are connected in series, the third and fourth light-emitting elements are connected in series, and the first and third light-emitting elements are connected in parallel.

11 Claims, 3 Drawing Sheets

LIGHT-EMITTING DEVICE INCLUDING LIGHT-EMITTING ELEMENTS CONNECTED IN SERIES AND LIGHT-EMITTING ELEMENTS CONNECTED IN PARALLEL

CROSS REFERENCE TO RELATED APPLICATION

This application claims priority to Japanese Patent Application No. 2015-171571 filed on Aug. 31, 2015. The entire disclosure of Japanese Patent Application No. 2015-171571 is hereby incorporated herein by reference.

BACKGROUND

1. Technical Field

The present disclosure of relates to a light-emitting device.

2. Description of Related Art

For example, a light-emitting device disclosed in Japanese Patent Application Publication No. 2013-125869 includes an electronic component mounting substrate that has a linear outer shape, and the electronic component mounting substrate has a first main surface, a second main surface on a side opposite to the first main surface, and a first lateral surface and a second lateral surface, which are lateral surfaces extending in the longitudinal direction. The electronic component mounting substrate includes a first terminal and a second terminal on the first main surface, a first wire that is arranged to extend on the first lateral surface along the longitudinal direction and is electrically connected to the first terminal, and a second wire that is arranged to extend on the second lateral surface along the longitudinal direction and is electrically connected to the second terminal. Further, a plurality of light-emitting elements mounted on the first terminal and the second terminal are electrically connected in parallel with the first wire and the second wire.

SUMMARY OF THE INVENTION

In conventional light-emitting devices as described above, in the case where the plurality of light-emitting elements are connected in series as well as in parallel, the number of wires is increased, which may lead to increase in the size of the light-emitting devices.

Accordingly, it is an object of an embodiment of the present invention to provide a small-size light-emitting device in which at least four light-emitting elements are connected in series and in parallel.

A light-emitting device according to an embodiment of the present invention includes a substrate having a first surface extended in a first direction, a second surface disposed on a side opposite to the first surface, a third surface disposed between the first surface and the second surface and extended in the first direction, and a fourth surface disposed on a side opposite to the third surface, a conductive member including at least four element mounting portions arranged in the first direction on the first surface, a first wiring portion arranged on the second surface, a second wiring portion arranged on the third surface, and a third wiring portion arranged on the fourth surface, and first, second, third, and fourth light-emitting elements respectively mounted on the four element mounting portions. With the first, second, and third wiring portions, the first light-emitting element and the second light-emitting element are connected in series, and the third light-emitting element and the fourth light-emitting element are connected in series, and the first light-emitting element and the third light-emitting element are connected in parallel.

According to an embodiment of the present invention, a small-size light-emitting device in which at least four light-emitting elements are connected in series and in parallel can be obtained.

DETAILED DESCRIPTION OF EMBODIMENTS

Figure 1:
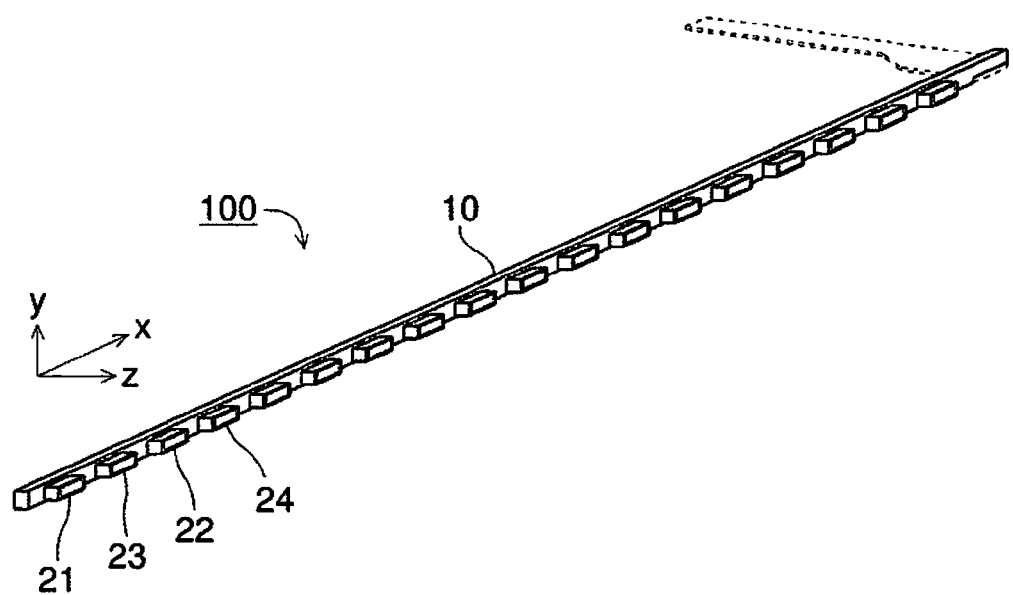
FIG. 1 is a schematic perspective view of a light-emitting device according to an embodiment of the present invention.

Hereinafter, certain embodiments of the present invention will be appropriately described referring to drawings. However, a light-emitting device described below is provided for the purpose of embodying the technical idea of the present invention, and is given not as a limitation to the scope of the present invention unless specifically stated otherwise. Also, the size and the positional relationship, etc. of members in each of the drawings may be exaggerated for ease of explanation.

It is noted that, in the drawings, a first direction is represented as x direction, and a second direction perpendicular to the first direction is represented as y direction in a front view of the light-emitting device. Also, a third direction perpendicular to the x direction and the y direction is represented as z direction. For example, a direction in parallel to one side defining the outline of a wiring substrate in a front view of the light-emitting device can be selected as the first direction, and in the case where the wiring substrate has a longitudinal direction and a lateral direction in a front view, the longitudinal direction can be selected as the first direction.

First Embodiment

Figure 2A:
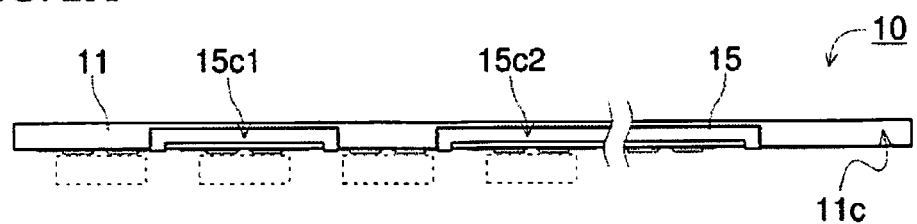
FIGS. 2A to 2D are schematic plan views illustrating the structures of four surfaces of a wiring substrate included in the light-emitting device in FIG. 1 each extending in a first direction.
Figure 2B:
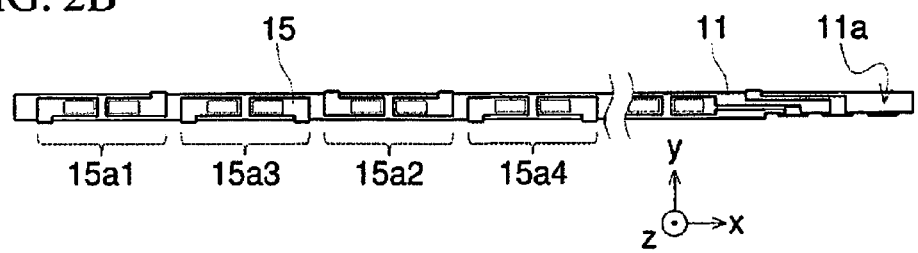

FIG. 1 is a schematic perspective view of a light-emitting device 100 according to a first embodiment. FIGS. 2A to 2D are schematic plan views illustrating the structures of four surfaces of a wiring substrate 10 included in the light-emitting device 100 each extending in the first direction. FIG. 3A is a schematic top view of a single light-emitting element among a plurality of light emitting elements 21, 22, 23, and 24 included in the light-emitting device 100. FIG. 3B is a schematic cross-sectional view taken along A-A of FIG. 3A. FIG. 3C is a schematic bottom view of a single light emitting element among the plurality of light-emitting elements 21, 22, 23, and 24. FIG. 3D is a schematic cross-sectional view of a single light-emitting element among the plurality of light-emitting elements 21, 22, 23, and 24, illustrating one example in a state mounted on the wiring substrate 10.

As illustrated in FIG. 1, the light-emitting device 100 according to the first embodiment is a linear light source elongated in the first direction. The light-emitting device 100 includes the wiring substrate 10 and at least four light-emitting elements 21, 22, 23, and 24. In the description below, the light-emitting device 100 is illustrated as a side-emission type (side-view type) light emitting device, and is illustrated so that a first direction is represented as a horizontal direction, a second direction is represented as a vertical direction, and a third direction is represented as a depth direction.

As illustrated in FIGS. 2A to 2D, the wiring substrate 10 includes a substrate 11 and a conductive member 15 arranged on the substrate 11. The substrate 11 includes a first surface 11a extending in the first direction, a second surface 11b disposed on an opposite side to the first surface 11a, a third surface 11c disposed between the first surface 11a and the second surface 11b and extending in the first direction, and a fourth surface 11d disposed on an opposite side to the third surface 11c. For example, the substrate 11 is a block having a rectangular-parallelepiped shape elongated in the first direction. It is noted that the surfaces extending in the first direction of the substrate 11 are not limited to the first, second, third, and fourth surfaces 11a, 11b, 11c, and 11d, but may include a flat surface or a curved surface that connects each of these surfaces. The substrate 11 may be, for example, a block having a shape of a hexagonal column or a rectangular parallelepiped shape having a rounded corner.

The conductive member 15 includes at least four element mounting portions 15a1, 15a2, 15a3, and 15a4 arranged in the first direction on the first surface 11a, a first wiring portion 15b1 arranged on the second surface 11b, second wiring portions 15c1 and 15c2 arranged on the third surface 11c, and third wiring portions 15d1 and 15d2 arranged on the fourth surface 11d. In the conductive member 15, the element mounting portions 15a1, 15a2, 15a3, and 15a4 are portions on which the light-emitting elements 21, 22, 23, and 24 are to be connected. The element mounting portions 15a1, 15a2, 15a3, and 15a4 each includes portions for disposing a pair of positive and negative terminals.

Each of the upper surfaces of the element mounting portions 15a1, 15a2, 15a3, and 15a4 is a surface in which a metal is exposed. It is noted that examples of the "metal" described herein include an alloy. The element mounting portions 15a1, 15a2, 15a3, and 15a4 may be formed by, as in the present embodiment, patterning the metal constituting the conductive member 15, or may be formed by providing openings in insulation protective films such as a resist or a coverlay arranged on the metal constituting the conductive member 15. In the conductive member 15, the wiring portions 15b 1, 15c1, 15c2, 15d1, and 15d2 are portions that connect the element mounting portions 15a1, 15a2, 15a3, and 15a4 and/or connect the element mounting portions 15a1, 15a2, 15a3, and 15a4 to external connection terminal portions 15e1, 15e2, and 15e3 described below. The wiring portions 15b 1, 15c1, 15c2, 15d1, and 15d2 may have such a structure that the metal constituting the conductive member 15 is exposed or that the metal constituting the conductive member 15 is covered by the insulating protective films such as a resist or a coverlay.

Figure 2C:
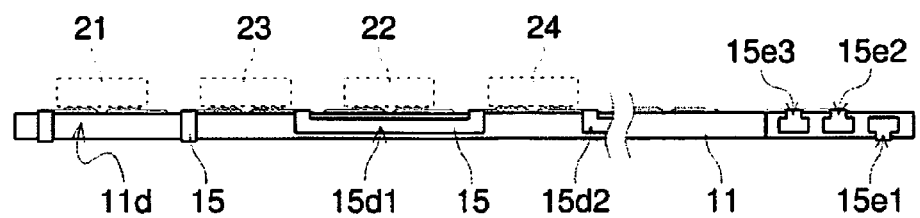
Figure 3A:
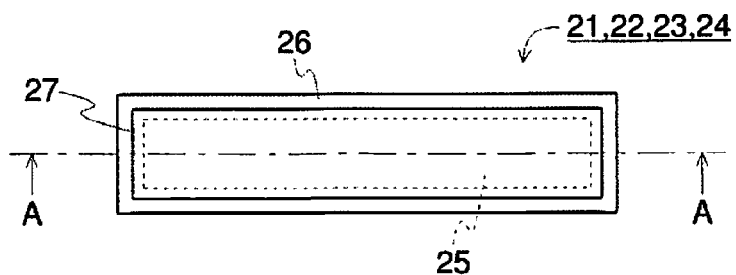
FIG. 3A is a schematic top view of a light-emitting element included in the light-emitting device in FIG. 1.
Figure 3B:
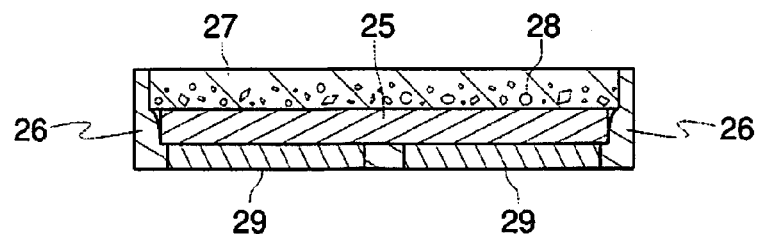
FIG. 3B is a schematic cross-sectional view taken along A-A of FIG. 3A.
Figure 3C:
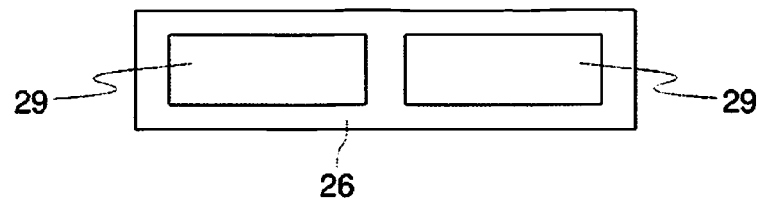
FIG. 3C is a schematic bottom view of the light-emitting element of FIG. 3A.
Figure 3D:
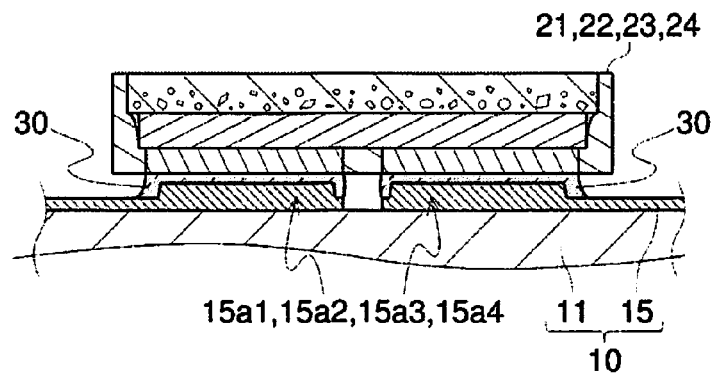
FIG. 3D is a schematic cross-sectional view of the light emitting element, illustrating one example in a state mounted on the wiring substrate.

As illustrated in FIGS. 2C and 3D, first, second, third, and fourth light-emitting elements 21, 22, 23, and 24 are respectively mounted on the four element mounting portions 15a1, 15a2, 15a3, and 15a4.

Then, as illustrated in FIGS. 2A to 2D, with the first, second, and third wiring portions 15b1, 15c1, 15d1, the first light-emitting element 21 and the second light-emitting element 22 are connected in series, the third light-emitting element 23 and the fourth light-emitting element 24 are connected in series, and the first light-emitting element 21 and the third light-emitting element 23 are connected in parallel.

Thus, three surfaces of the substrate 11 of the wiring substrate that extend in the first direction other than the surface on which the element mounting portions 15a1, 15a2, 15a3, and 15a4 are arranged are utilized as regions on which the wiring portions 15b1, 15c1, and 15d1 are arranged. With this arrangement, the small-size light-emitting device 100, in which at least four light-emitting elements 21, 22, 23, and 24 are connected in series and in parallel, can be formed. It is noted that a term "small-size" encompasses being a thin type.

In the description below, preferable forms of the light-emitting device 100 will be described in detail.

As shown in FIGS. 2A to 2D, the conductive member 15 includes a plurality of external connection terminal portions 15e1, 15e2, and 15e3 electrically connected to the first, second, third, and fourth element mounting portions 15a1, 15a2, 15a3, and 15a4. The external connection terminal portions 15e1, 15e2, and 15e3 are portions of the conductive member 15 that serve as terminals, which are to be connected to conductive bodies electrically connected to an external power supply. It is preferable that the plurality of external connection terminal portions 15e1, 15e2, and 15e3 be arranged on (only) any one surface of the first, second, third, and fourth surfaces 11a, 11b, 11c, and 11d. With this arrangement, small-sized connection portions between the external connection terminal portions 15e1, 15e2, and 15e3 and the conductive bodies electrically connected to the external power supply can be easily formed.

As shown in FIG. 2C, it is preferable that the plurality of external connection terminal portions 15e1I, 15e2, and 15e3 be arranged on one end portion of the substrate 11 in the first direction. With this arrangement, further small-sized connection portions between the external connection terminal portions 15e1, 15e2, and 15e3 and the conductive bodies electrically connected to the external power supply can be easily formed.

Figure 2D:
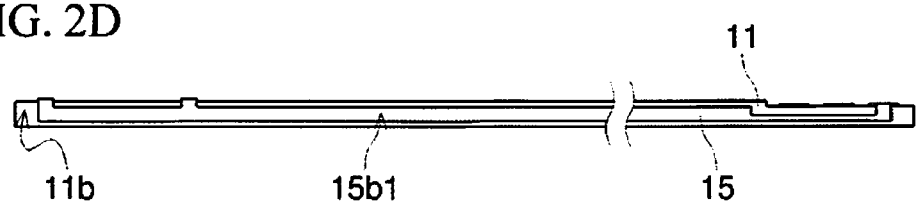

As illustrated in FIGS. 2B to 2D, on the surfaces on which the plurality of external connection terminal portions 15e1, 15e2, and 15e3 are arranged, it is preferable that sections on which the plurality of external connection terminal portions 15e1, 15e2, and 15e3 are arranged be depressed with respect to other sections. With this arrangement, an increase in the thickness of the light-emitting device 100 due to the connection between the external connection terminal portions 15e1, 15e2, and 15e3 and the conductive bodies electrically connected to the external power supply, can be suppressed. In particular, it is preferable that the depth of the depression be equal to or greater than the sum of the thickness of a joint member (a flexible circuit substrate, an electric supply cable, or the like) including the conductive bodies electrically connected to the external power supply, the thickness of the external connection terminal portions 15e1, 15e2, and 15e3, and the thickness of a bonding member for bonding these members, more preferably, be greater than the sum of these. With such thickness, the joint member can be arranged within the depth of the depression.

As illustrated in FIGS. 1 and 2C, it is preferable that the first light-emitting element 21, the third light-emitting element 23, the second light-emitting element 22, and the fourth light-emitting element 24 be arranged in this order in the first direction. That is, it is preferable that a light emitting element that belongs to a first series element group including the first light-emitting element 21 and the second light-emitting element 22 and a light emitting element that belongs to a second series element group including the third light-emitting element 23 and the fourth light-emitting element 24 be alternately arranged in the first direction. Accordingly, in the case where the first series element group and the second series element group separately emit light, the unevenness in the luminance distribution of the light-emitting device can be easily reduced. Consequently, in view of this, it is preferable that the first, second, third, and fourth light-emitting elements 21, 22, 23, and 24 be arranged to be spaced at approximately regular intervals in the first direction.

As illustrated in FIGS. 1 and 2A to 2D, it is preferable that the first light-emitting element 21 and the second light-emitting element 22 be connected in series by the second wiring portion 15c1, and the third light-emitting element 23 and the fourth light-emitting element 24 be connected in series by the third wiring portion 15d1, and the first light-emitting element 21 and the third light-emitting element 23 be connected in parallel by the first wiring portion 15b1. With this arrangement, the resistance of the second wiring portion 15c1 and the resistance of the third wiring portion 15d1 can be easily balanced, and the occurrence of a difference between light emission output of the first series element group including the first light-emitting element 21 and the second light-emitting element 22 and light emission output of the second series element group including the third light-emitting element 23 and the fourth light-emitting element 24, which is attributed to the difference between the resistance of the second wiring portion 15c1 and the resistance of the third wiring portion 15d1, can be easily suppressed.

It is preferable that the third surface 11c have a recess whose depth is greater than the thickness of the second wiring portions 15c1 and 15c2, and that the second wiring portions 15c1 and 15c2 be arranged in the recess. It is preferable that the fourth surface 11d have a depression whose depth is greater than the thickness of the third wiring portions 15d1 and 15d2, and that the third wiring portions 15d1 and 15d2 be arranged in the recess. Accordingly, the second wiring portions 15c1 and 15c2 and/or the third wiring portions 15d1 and 15d2 are arranged on an inner side with respect to the outermost surface of the substrate 11, so that unintended short circuit can be avoided. Also, in the case where the third surface 11c or the fourth surface 11d serves as a surface on which the light-emitting device 100 is arranged, inclination of the light-emitting device 100 at the time of arranging the light-emitting device 100 can be reduced.

As illustrated in FIGS. 3A to 3C, the first, second, third, and fourth light-emitting elements 21, 22, 23, and 24 each include an LED chip 25, covering members 26 and 27 (in the description below, referred to as a first covering member 26 and a second covering member 27, respectively), and terminals 29. The first covering member 26 is light-reflective. The second covering member 27 is light-transmissive. The second covering member 27 contains a fluorescent substance 28. The terminals 29 include a pair of positive and negative terminals and connected to the lower surface of the LED chip 25. Thus, it is preferable that the first, second, third, and fourth light-emitting elements 21, 22, 23, and 24 each include the LED chip 25 and the light-reflective covering member 26 that covers lateral surfaces of the LED chip 25. With this arrangement, the light-emitting elements 21, 22, 23, and 24 each including a light-reflective surrounding body and in which a main light emission surface serves as the main surface thereof (herein, the upper surface), can be miniaturized, so that the light-emitting device 100 can be miniaturized, which allows the light-emitting elements 21, 22, 23, and 24 to be arranged with high density, that is, with narrow pitches.

As illustrated in FIG. 3D, it is preferable that each of the first, second, third, and fourth light-emitting elements 21, 22, 23, and 24 be flip-chip mounted. That is, in the first, second, third, and fourth light-emitting elements 21, 22, 23, and 24, the terminals 29 are bonded to the element mounting portions 15a1, 15a2, 15a3, and 15a4 via bonding members 30. With this arrangement, wires are not required for mounting the light-emitting elements 21, 22, 23, and 24, so that the light-emitting elements 21, 22, 23, and 24 can be arranged with high density, that is, with narrow pitches. Furthermore, in each of the first, second, third, and fourth light-emitting elements 21, 22, 23, and 24, it is preferable that the terminals 29 be formed only on the lower surface thereof. Accordingly, the bonding members 30 are not formed on the lateral surfaces of the light-emitting elements 21, 22, 23, and 24 (i.e., filletless mounting), and the light-emitting elements 21, 22, 23, and 24 can be arranged with higher density.

It is noted that the light-emitting device 100 can be manufactured, for example, as described below. A plurality of through grooves are formed on a large-size substrate made of the base material of the substrate 11, thereby manufacturing a slit substrate including a plurality of substrates 11 connected to the inside of a frame body. The through grooves can be formed by router machining using numerical control (NC) devices, punching machining with press metal mold, laser machining devices, or the like. Subsequently, electroless copper plating and/or electrolytic copper plating is performed to the slit substrate, so that a copper layer is formed on the upper and lower surfaces of the substrate and lateral surfaces of the through grooves. Then, resist is applied on upper and lower surfaces of the substrate and the lateral surfaces of the through grooves by an electrodeposition (ED) method, and then the exposure, development, and etching processes of the resist are performed, so that a conductor pattern made of copper is formed on the upper and lower surfaces of the substrate and the lateral surfaces of the through grooves. Finally, for example, Ni/Au plating may be further applied on the conductor pattern. As described above, a collective substrate including the plurality of wiring substrates 10 is manufactured, and after the light-emitting elements are mounted on the collective substrate, the collective substrate may finally be singulated into each light-emitting device by dicing.

In the description below, each constituent element of the light-emitting device according to an embodiment of the present invention will be illustrated in detail.

Light-Emitting Device 100

The light-emitting device is not limited to the lateral surface light emitting type (side-view type) but may be of an upper surface light emitting type (top-view type).

Wiring Substrate 10

Substrate 11

For the base material of the substrate, resin (examples thereof include fiber reinforced resin), ceramics, glass, metal, paper, or the like can be employed. Examples of the resin include epoxy resin, glass epoxy resin, bismaleimide-triazine (BT) resin, polyimide resin, and the like. Examples of the ceramics include aluminum oxide, aluminum nitride, zirconium oxide, zirconium nitride, titanium oxide, titanium nitride, and the mixture of any of these materials. Examples of the metal include copper, iron, nickel, chrome, aluminum, silver, gold, titanium, and an alloy of any of these materials.

Among them, it is preferable that the base materials of the substrate be a resin, which is relatively low in cost. Among the examples of the resin, glass epoxy resin or BT resin is preferable, and in particular, BT resin has good thermal resistance and low thermal expansion properties, which is suitable for precision machining.

Conductive Member 15

The conductive member is formed at least on a surface of the substrate and may be formed in the interior of the substrate. The conductive member can be formed of copper, iron, nickel, tungsten, chrome, aluminum, silver, gold, titanium, palladium, rhodium, or an alloy of any of these. A single layer or multiple layers made of the aforementioned metal or the alloy may be used for the conductive member. In particular, copper or a copper alloy is preferable in view of heat dissipation. For an outermost layer of the conductive member, a layer made of silver, platinum, aluminum, rhodium, gold, or an alloy of these may be employed, in view of wettability and/or light reflectivity of the bonding member.

Light-Emitting Elements 21, 22, 23, and 24

The light-emitting elements each include at least the LED chip and the terminals. Each of the light-emitting elements may further include a covering member. The light-emitting elements may be of a package type, in addition to a chip type (i.e., CSP; Chip Size Package) described in the present embodiment.

LED Chip 25

The LED chip may include the substrate, but the LED chip has at least an element structure made of various semiconductors. In particular, it is preferable that the LED chip be made of nitride semiconductors (for example, $In_xAl_yGa_{1-x-y}N$, $0 \le x$, $0 \le y$, $x+y \le 1$) capable of emitting light in a range of ultraviolet to visible regions. It is preferable that the peak wavelength of light emitted from the LED chip be 420 nm to 490 nm, more preferably, 445 nm to 465 nm in view of light emission efficiency, color mixture with light from another light source, excitation efficiency of wavelength conversion substances, or the like. Alternatively, the LED chip may be a gallium arsenide based semiconductor or a gallium phosphide based semiconductor, which can emit green to red light. In the case of the LED chip where a pair of positive and negative electrodes is arranged on the same surface side, each electrode may be connected to the element mounting portion of the conductive member with a wire (i.e., face-up type connection). Alternatively, each electrode may be connected, directly or via a conductive adhesive, to the element mounting portion of the conductive member (i.e., flip-chip type connection or face-down type connection). In the case of the LED chip where the pair of positive and negative electrodes are respectively arranged on surfaces opposite to each other, i.e., an upper surface and a lower surface of the LED chip, an electrode of the lower surface may be adhered, directly or via a conductive adhesive, to one electrode of the element mounting portion of the conductive member, and an upper surface electrode is connected to the other electrode of the element mounting portion of the conductive member with a wire. The number of LED chips mounted on one light-emitting element may be single or plural. The plurality of LED chips can be connected in series or in parallel. Also, for example, three LED chips that respectively emit blue, green, and red light may be mounted on one light-emitting element.

First Covering Member 26

The first covering member may be, for example, a member referred to as a "mold under fill". The first covering member covers lateral surfaces and a portion of the lower surface of the LED chip. The term "cover" described in the present specification includes not only a mode in which the first covering member is in contact with the LED chip, but also a mode in which a light transmissive member is interposed between the LED chip and the first covering member. Also, it is preferable that the first covering member also cover the lateral surface of the second covering member in view of reducing unevenness in the chromaticity distribution of light emitted from the light-emitting element. Examples of the base material of the first covering member include a silicone resin, an epoxy resin, a phenol resin, a polycarbonate resin, an acrylic resin, modified resin or hybrid resin of these. Among them, a silicone resin, a silicone modified resin, or silicone hybrid resin have good heat resistance and light resistance, and thus is preferable. It is preferable that the first covering member contains white pigments and/or fillers in the base material thereof, but any other appropriate form may be employed. For the white pigments, titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, or zirconium oxide can be employed singly or in combination of two or more kinds. The content of the white pigments in the first covering member can be appropriately selected, but it is preferable that the content be, for example, 10 wt % to 70 wt %, and more preferably, 30 wt % to 60 wt % in view of the light reflectivity and viscosity in a fluid state. It is noted that "wt %" refers to "percent by weight" and represents a ratio of weight of the material to the total weight of the first covering member. For the fillers, silica, glass, zinc oxide, and aluminum oxide can be employed singly or in combination of two or more kinds.

Second Covering Member 27

The second covering member covers at least the upper surface of the LED chip and seals the LED chip together with the first covering member or singly seals the LED chip. The second covering member may be a member having electrical insulation properties and light transmissiveness with respect to light emitted from the LED chip (preferably, the transmissivity of light at the peak emission wavelength of the LED chip is 70 percent or higher, more preferably, 85 percent or higher). Examples of the base material of the second covering member include a silicone resin, an epoxy resin, a phenol resin, a polycarbonate resin, an acrylic resin, and modified resin and hybrid resin of these. These examples may include a glass. Among them, a silicone resin, a silicone modified resin, or a silicone hybrid resin has good heat resistance and light resistance, and thus is preferable. It is preferable that the second covering member contains fluorescent substances and/or fillers in the base material thereof, but any form of the base material may be employed. For the fillers, one kind of silica, zinc oxide, aluminum oxide, zirconium oxide, and titanium oxide can be employed singly or in combination of two or more kinds.

Fluorescent Substance 28

The fluorescent substance absorbs at least a part of primary light emitted from the LED chip and emits secondary light of which the wavelength is different from the primary light. More specifically, examples of the fluorescent substance include yttrium aluminum garnet based phosphors (for example, $Y_3(Al, Ga)_5O_{12}:Ce$), lutetium aluminum garnet based phosphors (for example, $Lu_3(Al, Ga)_5O_{12}:Ce$), silicate based phosphors (for example, $(Ba, Sr)_2SiO_4:Eu$), chlorosilicate based phosphors (for example, $Ca_8Mg(SiO_4)_4Cl_2:Eu$), β sialon based phosphors (for example, $Si_{6-z}Al_zO_zN_{8-z}:Eu (0<Z<4.2)$), nitrogen-containing calcium aluminosilicate (CASN or SCASN) based phosphors (for example,(Sr, Ca)AlSiN3:Eu), and potassium fluorosilicate based phosphors (for example, K2SiF6:Mn) are included. Examples of the fluorescent substance may include quantum dots. The quantum dots are particles having the grain diameter in a range of 1 nm to 100 nm, and having the light emission wavelength that can be varied according to the grain diameter. Examples of the quantum dots include cadmium selenide, cadmium telluride, zinc sulfide, cadmium sulfide, lead sulfide, lead selenide, and mercury cadmium telluride. For the fluorescent substance, these materials can be used singly or in combination of two or more kinds.

Terminal 29

The terminal is constituted of a piece of a metal or an alloy. More specifically, examples of the metal and the alloy include, gold, silver, copper, tin, platinum, zinc, nickel, or an alloy of these, and in particular, it is preferable that gold, silver, copper, tin, zinc, or the alloy of these be used. Among them, copper has good thermal conductivity and is relatively inexpensive, so that copper or a copper alloy is particularly preferable. Also, gold or a gold alloy is also preferable because gold is chemically stable, has less surface oxidation, and can be bonded easily. The terminals may be a protruded electrode (e.g., a bump or pillar) or a lead electrode (e.g., a singulated lead frame) or may function as the electrodes of the LED chip. Also, in view of the wettability of the bonding member, a layer made of silver, gold, or an alloy of these may be arranged on the surface layer of each of the terminals.

Bonding Member 30

Examples of the bonding member include metal and an alloy that can be fused by heating. The bonding member before subjected to heat treatment is, for example, in paste form. Various types of solder can be used for the bonding member. More specifically, examples of the solder include tin-bismuth based, tin-copper based, tin-silver based, or gold-tin based solder. Also, a resin reinforced type solder including thermosetting resin may be used.

EXAMPLES

Hereinafter, examples according to the present invention will be described in detail. It is needless to say that the present invention is not limited to only the example described below.

Example 1

The light-emitting device according to Example 1 is a side-emission type LED device having a structure of the light-emitting device 100 of the example shown in FIG. 1, and the light-emitting device has a lateral width of 50 mm, a longitudinal width of 0.35 mm, and a depth of 0.7 mm. The light-emitting device has a structure such that, as described below, eighteen light-emitting elements are flip-chip mounted on a wiring substrate spaced at approximately regular intervals in the horizontal direction (right-and-left direction) via the bonding member.

The wiring substrate includes a substrate and conductive members arranged on the substrate. The substrate is made of BT resin (for example, HL832NSF type LCA manufactured by Mitsubishi Gas Chemical Company, Inc.) and a block of a parallelepiped shape having a lateral width of 50 mm, a longitudinal width of 0.35 mm, and a depth of 0.3 mm. The conductive members are formed on four surfaces (first, second, third, and fourth surfaces) extended in the longitudinal direction of the substrate as conductive patterns. The conductive members are each made of a stacked layer of copper/nickel/gold (the total thickness (i.e., depth): 0.02 mm) from the side of the substrate. Eighteen element mounting portions (each including portions for disposing positive and negative electrodes) of the conductive members are formed on the first surface of the substrate. The element mounting portions each includes a protrusion having a thickness (depth) of 0.04 mm made of copper. The first, second, and third wiring portions of the conductive member are formed on the second, third, and fourth surfaces of the substrate, respectively. Nine light-emitting elements that are odd-numbered from the left are connected in series with the second wiring portion, and nine light-emitting elements that are even-numbered from the right are connected in series with the third wiring portion, and light-emitting elements that are the first and the second from the left are connected in parallel with the first wiring portion. Three external connection terminal portions of the conductive member are provided, and all the external connection terminal portions are formed at a right end portion of the fourth surface. At the right end portion where the external connection terminal portions are formed, a depression having a depth of 0.15 mm is disposed in the right end portion where the external connection terminal portions are formed, on the fourth surface.

The light-emitting elements each includes a LED chip, a pair of terminals formed on a lower side of the LED chip, a second covering member formed on an upper side of the LED chip, and a first covering member covering peripheries of these. The light-emitting element is an element having a rectangular parallelepiped shape with a lateral width of 1.35 mm, a longitudinal width of 0.32 mm, and a thickness (depth) of 0.3 mm. The LED chip is a chip capable of emitting blue light (having the light emission peak wavelength of 455 nm) in which an n-type layer an active layer, and a p-type layer, each of which are made of a nitride semiconductor, are sequentially stacked on a sapphire substrate, and having a lateral width of 1.1 mm, and a longitudinal width of 0.2 mm, and a thickness (depth) of 0.12 mm. The pair of terminals are pieces each having a thickness (depth) of 0.05 mm having a structure such that a nickel/gold film is formed on a surface of a base member made of copper, and the terminals are connected to the positive and negative electrodes of the LED chip. The second covering member is made of a hardened silicone resin containing β sialon based phosphors and potassium fluorosilicate based phosphors and having a lateral width of 1.16 mm, a longitudinal width of 0.22 mm, and a thickness (depth) of 0.13 mm. The first covering member is made of a hardened silicone resin containing 60 wt % of titanium oxide. The covering of the first covering member allows the upper surface of the second covering member to serve as the substantial light emission area of the light-emitting element. A lower surface of each of the pair of terminals is in the same plane with the lower surface of the first covering member, and is exposed in a lower surface of the light-emitting element in the form of a rectangular area.

The bonding member is a resin reinforced type solder (having a thickness (depth) of 0.02 mm) containing tin-bismuth based solder and epoxy resin. The bonding member is formed by fusing to wet-spread on the element mounting portion and on the pair of terminals and then hardening. The bonding member connects the wiring substrate and the light-emitting element.

The light-emitting device according to Example 1, constituted in the aforementioned manner, has an effect similar to that of the light-emitting device 100 according to the first embodiment.

INDUSTRIAL APPLICABILITY

The light-emitting device according to an embodiment of the present invention can be utilized for the backlight devices for a liquid crystal display, various lighting apparatuses, large-size displays, various display devices for advertisements or destination guide, projector devices, image reading devices for digital video cameras, facsimile machines, copying machines, scanners or the like, etc.

What is claimed is:

1. A light-emitting device comprising:
a substrate having a first surface extended in an x direction and a y direction, a second surface disposed on a side opposite to the first surface and extended in the x direction and the y direction, a third surface disposed between the first surface and the second surface and extended in the x direction and a z direction, and a fourth surface disposed on a side opposite to the third surface and extended in the x direction and the z direction;
a conductive member including at least four element mounting portions arranged in the x direction on the first surface, a first wiring portion arranged on the second surface, a second wiring portion arranged on the third surface, and a third wiring portion arranged on the fourth surface; and
first, second, third, and fourth light-emitting elements respectively mounted on the four element mounting portions,
wherein, with the first, second, and third wiring portions, the first light-emitting element and the second light-emitting element are connected in series, and the third light-emitting element and the fourth light-emitting element are connected in series, and the first light-emitting element and the third light-emitting element are connected in parallel.

2. The light-emitting device according to claim 1,
wherein the conductive member includes a plurality of external connection terminal portions electrically connected to the first, second, third, and fourth element mounting portions, and
wherein the plurality of external connection terminal portions are arranged on any one surface of the first, second, third, and fourth surfaces.

3. The light-emitting device according to claim 2,
wherein the plurality of external connection terminal portions are arranged on one end portion of the substrate in the x direction.

4. The light-emitting device according to claim 2,
wherein, in a surface of the conductive member on which the plurality of external connection terminals are arranged, a section on which the plurality of external connection terminal portions are arranged are depressed with respect to the other section.

5. The light-emitting device according to claim 3,
wherein, in a surface of the conductive member on which the plurality of external connection terminals are arranged, a section on which the plurality of external connection terminal portions are arranged are depressed with respect to the other section.

6. The light-emitting device according to claim 1,
wherein the first light-emitting element, the third light-emitting element, the second light-emitting element, and the fourth light-emitting element are arranged in this order in the x direction.

7. The light-emitting device according to claim 1,
wherein the first light-emitting element and the second light-emitting element are connected in series with the second wiring portion,
wherein the third light-emitting element and the fourth light-emitting element are connected in series with the third wiring portion, and
wherein the first light-emitting element and the third light-emitting element are connected in parallel with the first wiring portion.

8. The light-emitting device according to claim 1,
wherein the third surface includes a recess having a depth greater than a thickness of the second wiring portion, and the second wiring portion is arranged in the recess, and/or
wherein the fourth surface includes a recess having a depth greater than a thickness of the third wiring portion, and the third wiring portion is arranged in the recess.

9. The light-emitting device according to claim 1,
wherein the first light-emitting element, the second light-emitting element, the third light-emitting element, and the fourth light-emitting element are each flip-chip mounted.

10. The light-emitting device according to claim 1,
wherein the first light-emitting element, the second light-emitting element, the third light-emitting element, and the fourth light-emitting element each includes an LED chip and a light reflective covering member that covers a lateral surface of the LED chip.

11. The light-emitting device according to claim 1,
wherein a base material of the substrate is a resin.

* * * * *